United States Patent
Carlson

(10) Patent No.: US 9,978,772 B1
(45) Date of Patent: May 22, 2018

(54) MEMORY CELLS AND INTEGRATED STRUCTURES

(71) Applicant: Micron Technology, Inc., Boise, ID (US)

(72) Inventor: Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days. days.

(21) Appl. No.: 15/458,572

(22) Filed: Mar. 14, 2017

(51) Int. Cl.
H01L 29/792 (2006.01)
H01L 27/1157 (2017.01)
H01L 27/11582 (2017.01)
G11C 16/04 (2006.01)
G11C 16/16 (2006.01)

(52) U.S. Cl.
CPC .... H01L 27/11582 (2013.01); G11C 16/0466 (2013.01); G11C 16/16 (2013.01); H01L 27/1157 (2013.01)

(58) Field of Classification Search
USPC ............... 257/288, 314, 324–326, E29.309, 257/E21.423
See application file for complete search history.

(56) References Cited

U.S. PATENT DOCUMENTS

2005/0138262 A1 6/2005 Forbes
2009/0242956 A1 10/2009 Heng et al.

OTHER PUBLICATIONS

U.S. Appl. No. 15/409,412, filed Jan. 18, 2017, Carlson et al.
High-K Materials for Tunnel Barrier Engineering in Future Memory Technologies; Electrochemical Society Proceedings; Fall 2004; pp. 169-171.
Band Engineered Tunnel Oxides for Improved TANOS-type Flash Program/Erase with Good Retention and 100K Cycle Endurance; Apr. 27-29, 2009; IEEE; pp. 156-157.
A High Performance and Scalable FinFET BE-SONOS Device for NAND Flash MEmory Application; Apr. 21-23, 2008; IEEE; 2 pp.
A critical review of charge-trapping NAND flash devices; Oct. 20-23, 2008; IEEE; 4 pp.
Scaling Evaluation of BE-SONOS NAND Flash Beyond 20 nm; Jun. 17-19, 2008; IEEE; pp. 116-117.

*Primary Examiner* — Kimberly Rizkallah
*Assistant Examiner* — Bo Bin Jang
(74) *Attorney, Agent, or Firm* — Wells St. John P.S.

(57) ABSTRACT

A memory cell comprises, in the following order, channel material, a charge-passage structure, charge-storage material, a charge-blocking region, and a control gate. The charge-passage structure comprises a first material closest to the channel material, a third material furthest from the channel material, and a second material between the first material and the third material. Dielectric constant (k) of the first material is less than 5.0. Sum of bandgap (BG) and electron affinity (chi) of the second material is no greater than 6.7 eV. The k of the second material is at least 5.0. Sum of BG and chi of the third material is less than 9.0 eV and at least 0.5 eV greater than the sum of the BG and the chi of the second material.

34 Claims, 4 Drawing Sheets

US 9,978,772 B1

MEMORY CELLS AND INTEGRATED STRUCTURES

TECHNICAL FIELD

Embodiments disclosed herein pertain to memory cells and to integrated structures, for example those that incorporate memory cells.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

DETAILED DESCRIPTION OF EXAMPLE EMBODIMENTS

Operation of NAND memory cells may comprise movement of charge between a channel material and a charge-storage material, with movement of "charge" corresponding to movement of charge carriers (e.g., electrons and holes). For instance, programming of a NAND memory cell may comprise moving charge (e.g., electrons) from the channel material into the charge-storage material, and then storing the charge within the charge-storage material. Erasing of the NAND memory cell may comprise moving holes into the charge-storage material to recombine with electrons stored in the charge-storage material, and thereby release charge from the charge-storage material. The charge-storage material may comprise charge-trapping material (for instance, silicon nitride, metal dots, etc.) which reversibly traps charge carriers. It is desired that the charge-trapping material have appropriate charge-trapping probability and/or charge-trapping rate in order that charge carriers are effectively trapped and retained within the charge-trapping material. Charge-trapping probability and charge-trapping rate of a charge-trapping material may be related to the volumetric density of charge traps within charge-trapping material, the energy of the charge traps (i.e., the depths of the charge traps in energy wells), etc.

Channel material may be separated from charge-storage material by insulator/insulating/insulative (i.e., electrical herein) material, and such insulator material may be characterized by an effective oxide thickness (EOT). It can be desired that the insulator material have sufficient EOT to preclude undesired back-migration (i.e., leakage) of charges from the charge-storage material to the channel material. However, increasing EOT can increase the difficulty of removing trapped charges from materials having relatively deep charge traps. It is therefore desired to engineer insulator materials suitable for spacing charge-storage material from channel material to achieve desired EOT for precluding undesired leakage, while also permitting deeply-trapped charges to be removed during an ERASE operation. Further, it is also generally desired that such insulator material not parasitically trap charge carriers therein, or that such parasitic trapping be minimized. Some embodiments include improved NAND memory cells which incorporate charge-passage structures within or as the insulator material between charge-storage structures and channel material. Example embodiments are described with reference to FIGS. 1-4.

Figure 1:
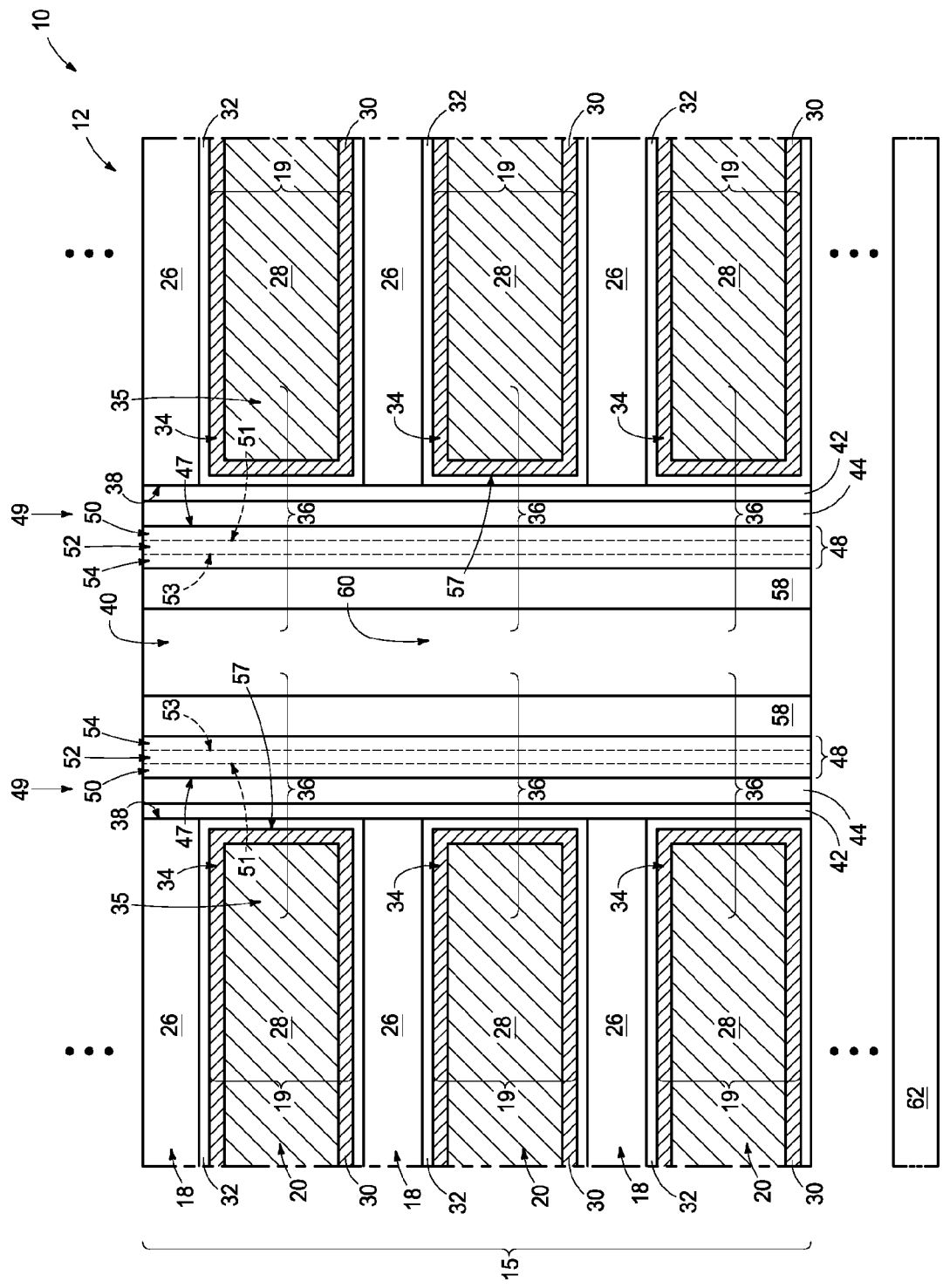
FIG. 1 is a diagrammatic cross-sectional side view of an example integrated structure having a region of an example NAND memory array.

Referring to FIG. 1, a portion of an integrated structure 10 is illustrated, with such portion being a fragment of a 3-dimensional (3D) NAND memory array 12. Integrated structure 10 comprises a vertical stack 15 comprising vertically-alternating levels 18 and 20. Example levels 20 comprise conductor/conducting/conductive (i.e., electrical herein) material 19 and example levels 18 comprise insulator material 26. An example insulator material 26 is doped or undoped silicon dioxide. In one embodiment and as shown, conductive material 19 comprises conductive materials 28 and 30. In one embodiment, conductive material 28 may be considered to be a conductive core, and conductive material 30 may be considered to be an outer conductive layer surrounding the conductive core. Conductive materials 28 and 30 may comprise different compositions relative one another. Examples for each include elemental metals (e.g., tungsten, titanium, copper, etc.), conductive metal compounds (e.g., metal nitrides, metal silicides, metal carbides, etc.), and conductively-doped-semiconductive materials (e.g., silicon, gallium, etc.), including mixtures thereof. In one embodiment, an insulator material 32 forms an insulative liner surrounding outer conductive material layer 30, and may comprise high-k material (e.g., aluminum oxide), where "high-k" means a dielectric constant greater than that of silicon dioxide. Alternately, and by way of examples only, insulator material 32 may be eliminated and/or conductive material 19 may be homogenous. Levels 18 and 20 may be of any suitable vertical thicknesses. In some embodiments, levels 18 and levels 20 may have respective vertical thicknesses of about 10 nanometers (nm) to 300 nm. In some embodiments, levels 18 and 20 have the same vertical thickness and in other embodiments have different vertical thicknesses.

In the example embodiment, insulator materials 26 and 32 together form sidewalls 38 which in one embodiment are vertical. Sidewalls 38 may be considered to be sidewalls of an opening 40 extending through stack 15. Opening 40 may have a continuous shape when viewed from above or in horizontal cross-section, and may be, for example, circular, elliptical, etc. Accordingly, sidewalls 38 of FIG. 1 may be comprised by a continuous sidewall that extends around the periphery of opening 40.

In some embodiments, levels 20 may be wordline levels of a NAND memory array. Example terminal ends 34 of wordline levels 20 may function as control-gate regions 35 of NAND memory cells 36, with approximate locations of memory cells 36 being indicated with brackets in FIG. 1. As shown, memory cells 36 are vertically stacked and form an elevationally-extending (e.g., vertical) string 49 of memory cells 36 (e.g., a NAND string), with the number of memory cells in each string being determined at least in part by the number of levels 20. The stack may comprise any suitable number of conductive-material-containing levels 20. For instance, the stack may have 8 such levels, 16 such levels, 32 such levels, 64 such levels, 512 such levels, 1028 such levels, etc. Additionally, memory cells 36 may be constructed to effectively be completely encircling relative to individual openings 40 such that each opening 40 has one and only one elevationally-extending string 49 (e.g., individual string 49 in horizontal cross-section being a continuous-completely-encircling-annular ring). Alternately, memory cells 36 may be constructed to effectively not be completely encircling relative to individual openings 40 such that each opening 40 may have two or more elevationally-extending strings 49 (e.g., multiple memory cells 36 with multiple wordlines per level 20).

Channel material 58 extends elevationally along vertical stack 15 within opening 40. Such may comprise any suitable material, for example comprising, consisting essentially of, or consisting of appropriately-doped silicon. Channel material 58 as shown comprises an elevationally-extending cylinder, for example as a commonly termed hollow-channel configuration. A radially internal volume of channel material 58 may comprise a void space (not shown) or may comprise insulator material 60 extending along a middle of opening 40 radially within channel material 58. Insulator material 60 may comprise, for example, silicon dioxide, silicon nitride, etc. In another example embodiment, channel material 58 may entirely fill (not shown) the central region of opening 40 to form an elevationally-extending pedestal of channel material within such central region.

A charge-passage structure 48 is laterally (e.g., radially) outward of channel material 58 and extends elevationally there-along. Charge-passage structure 48 comprises a first material 54 closest to channel material 58 and a third material 50 furthest from channel material 58. A second material 52 is between first material 54 and third material 50. In one embodiment, first material 54 is directly against second material 52. In one embodiment, second material 52 is directly against third material 50. A dashed line 51 is provided to diagrammatically illustrate an approximate boundary between first material 54 and second material 52, and a dashed line 53 is provided to diagrammatically illustrate an approximate boundary between second material 52 and third material 50. In some embodiments, one or both of first material 54 and third material 50 are not directly against (not shown) second material 52. In the shown embodiment, materials 50, 52, and 54 are of the same horizontal width/thickness as one another. In other embodiments, one or more of materials 50, 52, and 54 may be of a different horizontal thickness (not shown) as compared to others of materials 50, 52, and 54. By way of examples, horizontal thickness for each of materials 50, 52, and 54 is 65 nm to 500 nm. Additional attributes of materials 54, 52, and 50 of charge-passage structure 48 are described below.

Charge-storage material 44 is laterally (e.g., radially) outward of charge-passage structure 48 and within levels 20 comprising conductive material 19. Charge-storage material 44 may comprise any suitable composition(s), and in some embodiments may comprise floating gate material (for instance, doped or undoped silicon) or charge-trapping material (for instance, silicon nitride, metal dots, etc.). In some embodiments, charge-storage material 44 may comprise, consist essentially of, or consist of silicon nitride. In some embodiments, charge-storage material 44 may consist of silicon nitride, and may have a thickness of 15 nm to 500 nm. In one embodiment and as shown, charge-storage material 44 extends elevationally along charge-passage structure 48, in one embodiment is directly against charge-passage structure 48, and in one embodiment is directly against third material 50 thereof.

A charge-blocking region is within levels 20. Such a region is laterally (e.g., radially) outward of charge-passage structure 48 and laterally (e.g., radially) inward of conductive material 19. An example charge-blocking region as shown comprises an insulator material 42 (e.g., in combination with insulator material 32 when present). Insulator material 42 may comprise any suitable composition(s), for example one or more oxides such as silicon dioxide, etc., and may be of any suitable thickness (e.g., 100 nm to 300 nm). By way of further examples, a charge-blocking region may comprise a laterally (e.g., radially) outer portion of the charge-storage material (e.g., material 44) where such charge-storage material is insulative (e.g., in the absence of any different-composition material between insulative-charge-storage material 44 and conductive material 19). Regardless, as an additional example, an interface of a charge-storage material and conductive material of a control gate may be sufficient to function as a charge-blocking region in the absence of any separate-composition-insulator material 32/42. Further, an interface 57 of conductive material 19 with material 32/42 (when present) in combination with insulator material 32/42 may together function as a charge-blocking region, and as alternately or additionally may a laterally-outer region of an insulative-charge-storage material (e.g., a silicon nitride material 44). A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells.

Stack 15 in the example embodiment is supported by a base 62. A break is shown between base 62 and stack 15 to indicate that there may be additional materials and/or integrated circuit structure between base 62 and stack 15. In some applications, such additional integrated materials may include, for example, source-side select gate material (SGS material). Base 62 may comprise semiconductor material, for example, comprising, consisting essentially of, or consisting of monocrystalline silicon. Base 62 may be referred to as a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In some applications, base 62 may correspond to a semiconductor substrate containing one or more materials associated with integrated circuit fabrication. Such materials may include, for example, one or more of refractory-metal materials, barrier materials, diffusion materials, insulator materials, etc.

In one embodiment, first material 54 of charge-passage structure 48 is directly against channel material 58. In one embodiment, third material 50 of charge-passage structure 48 is directly against charge-storage material 44. Regardless, in a first embodiment, dielectric constant (k) of first material 54 is less than 5.0 (i.e., not inclusive of 5.0). In such first embodiment, sum of bandgap (BG) and electron affinity (chi) of second material 52 is no greater than 6.7 eV (i.e., inclusive of 6.7) and k of second material 52 is at least 5.0 (i.e., inclusive of 5.0). In such first embodiment, sum of BG and chi of third material 50 is less than 9.0 eV and at least 0.5 eV greater than the sum of the BG and the chi of second material 52.

In some first embodiments, the k of first material 54 is at least 3.5. In some first embodiments, at least a majority (i.e., greater than 50% up to and including 100%) of first material 54 is a silicon oxide (e.g., $SiO_2$, a non-stoichiometric silicon oxide, a silicon oxide containing additional atoms beyond silicon atoms and oxygen atoms, etc.). In some first embodiments, first material 54 is devoid of silicon oxide. In the context of this document, "devoid" of a stated material includes from 0 to no more than 0.001 molar percent in the stated material (first material 54 in this instance).

In some first embodiments, the sum of the BG and the chi of second material 52 is at least 4.5 eV, in some such embodiments at least 5.0 eV, in some such embodiments no greater than 6.5 eV, in some such embodiments no greater than 6.0 eV, and in some such embodiments is from 4.0 eV to 6.7 eV. In some first embodiments, k of second material 52 is no greater than 60.0, in some such embodiments from 10.0 to 40.0, and in some such embodiments from 10.0 to 25.0.

In some first embodiments, second material 52 comprises at least one of an oxide, a silicate, an aluminate, and a gallate of hafnium, zirconium, tantalum, niobium, or titanium, including mixtures of two or more of hafnium, zirconium, tantalum, niobium, and titanium. In some such embodiments, the at least one of oxide, silicate, aluminate and gallate is stoichiometric and in alternate such embodiments is non-stoichiometric. In some non-stoichiometric embodiments, the at least one of oxide, silicate, aluminate, and gallate include a mixture of two or more of hafnium, zirconium, tantalum, niobium, and titanium. Specific examples include, regardless if stoichiometric or if non-stochiometric, hafnium oxide(s), hafnium silicate(s), hafnium aluminate(s), hafnium gallate(s), zirconium oxide(s), zirconium silicate(s), zirconium aluminate(s), zirconium gallate(s), tantalum oxide(s), tantalum silicate(s), tantalum aluminate(s), tantalum gallate(s), niobium oxide(s), niobium silicate(s), niobium aluminate(s), niobium gallate(s), titanium oxide(s), titanium silicate(s), titanium aluminate(s), titanium gallate(s), and gallium silicate(s). In some first embodiments, second material 52 is devoid of silicon nitride (whether stoichiometric or non-stoichiometric).

In some first embodiments, the BG of third material 50 is from 4.0 eV to 7.0 eV and the chi of the third material is from 1.0 eV to 2.5 eV. In some such embodiments, sum of the BG and the chi of third material 50 is at least 5.0 eV, in some such embodiments from 7.0 eV to 8.5 eV, and in some such embodiments from 7.5 eV to 8.0 eV. In some embodiments, third material 50 comprises at least one of an oxide, a silicate, an aluminate, and a gallate of hafnium, zirconium, tantalum, niobium, or titanium, including mixtures of two or more of hafnium, zirconium, tantalum, niobium, and titanium, for example as described above with respect to second material 52 (i.e., with the sum of the BG and the chi of third material 50 being less than 9.0 eV and at least 0.5 eV greater than the sum of the BG and the chi of second material 52 in the first embodiments). In some such embodiments, the at least one of oxide, silicate, aluminate and gallate is stoichiometric and in alternate such embodiments is non-stoichiometric. In some non-stochiometric embodiments, the at least one of oxide, silicate, aluminate and gallate include a mixture of two or more of hafnium, zirconium, tantalum, niobium, and titanium.

In a second embodiment, the k of first material 54 is from 3.5 to less than 5.0, the BG of first material 54 is from 8.5 eV to 9.5 eV, and the chi of first material 54 is from 0.7 eV to 1.1 eV. In such second embodiment, the k of second material 52 is from 5.0 to 60.0, the BG of second material 52 is from 3.5 eV to 5.0 eV, and the chi of second material 52 is from 1.0 eV to 3.0 eV. In such second embodiment, the k of third material 50 is less than the k of second material 52 and also is at least 4.0, the BG of third material 50 is from 4.0 eV to 7.0 eV, and the chi of third material 50 is from 1.0 eV to 2.5 eV. In some second embodiments, the k of second material 52 is at least 9.0, the BG of second material 52 is less than 5.0 eV, and the chi of second material 52 is at least 2.0 eV. Regardless, ideally as the k increases for second material 52 and/or thickness of second material 52 decreases, the sum of the BG of third material 50 and the chi of third material 50 decreases to be closer to the sum of the BG of second material 52 plus the chi of second material 52.

Memory cells and integrated structures in accordance with the invention may include combined attributes of the first embodiment (i.e., including the sub-embodiments thereof) and the second embodiment (i.e., including sub-embodiments thereof). Accordingly, any attribute(s) or aspect(s) as shown and/or described relative to the first embodiment may apply to the second embodiment and vice versa.

Charge-passage structure 48 can function as a material through which charge carriers tunnel (e.g., Fowler-Nordheim tunneling, Frenkel-Poole tunneling, direct tunneling, trap-assisted tunneling, etc.) or otherwise pass during programming operations, erasing operations, etc. Charge-passage structure 48 is engineered as described to have appropriate properties to provide sufficient EOT to preclude undesired back-migration (i.e., leakage) of charge carriers from charge-storage material 44 to channel material 58 while also permitting charge carriers within charge-storage material 44 to be removed from material 44 (i.e., transferred from charge-storage material 44 to channel material 58) during an ERASE operation.

Figure 2:
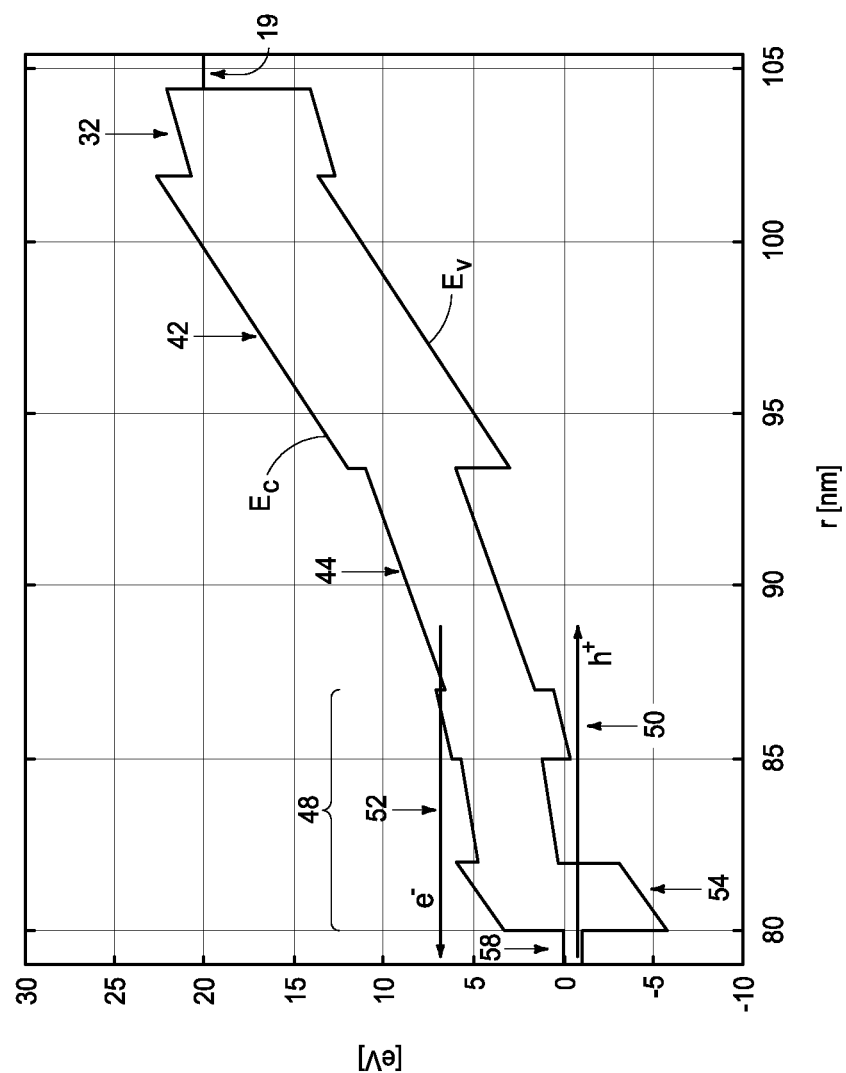
FIG. 2 is a band diagram illustrating example operational characteristics for an integrated structure analogous to that of FIG. 1.
Figure 3:
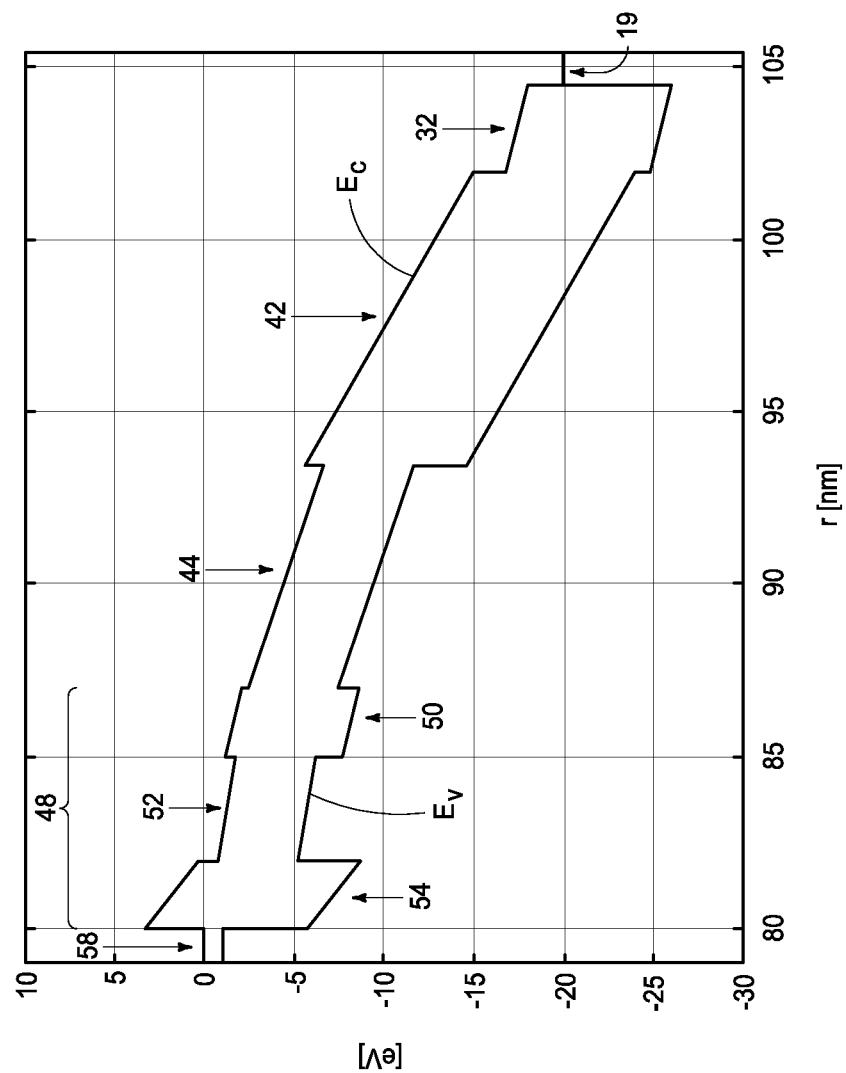
FIG. 3 is a band diagram illustrating example operational characteristics for an integrated structure like that of FIG. 1, and corresponds to the same structure whose example operational characteristics are shown in FIG. 2.

Example embodiments are further described with reference to FIGS. 2-4. Referring to FIG. 2, a band diagram is shown for a construction like that of FIG. 1 showing valence ($E_v$) and conduction ($E_c$) bands in volts (y-axis) as a function of radius (in nm) of materials 58, 54, 52, 50, 44, 42, 32, and 19 from the radial center of opening 40 in FIG. 1. FIG. 2 shows an erasing state or action for voltage differential between channel material 58 and control-gate material 19 of −20 volts whereby holes (+h) tunnel from left-to-right from channel material 58 within a regime that enables such tunneling holes to cross charge-passage structure 48 without being impeded by second material 52 and third material 50. The holes may ease removal of electrons (e−) from charge-storage material 44. Charge carriers (e.g., electrons) in charge-storage material 44 may essentially combine with holes, thus essentially deleting charge from charge-storage material 44 to erase from a high or highest threshold voltage ($V_t$) memory state to low or lowest $V_t$ memory state. A desired voltage differential may be achieved by application of suitable voltage to conductive material 19, with no or ground voltage being provided to channel material 58. FIG. 3 shows an analogous band diagram for the same construction as that of FIG. 2 for programming a memory cell 36 to a high $V_t$ state for a +20 volts differential between channel material 58 and control-gate material 19 whereby charge carriers (e.g., electrons) within channel region material 58 tunnel left-to-right to be trapped in charge-storage material 44.

FIGS. 2 and 3 represent a suitably doped semiconductor material 58 (e.g., polysilicon), silicon nitride as charge-storage material 44, silicon dioxide as insulator material 42, and aluminum oxide as insulator material 32. First material 54 of charge-passage structure 48 is silicon dioxide. Second material 52 and third material 50 are different composition silicon and hafnium-containing oxides (for example, different composition hafnium silicates). Specifically, second material 52 is $Hf_{0.9}Si_{0.1}O_2$ and third material 50 is $Hf_{0.5}Si_{0.5}O_2$. For silicon-dioxide-first material 54, the k, the BG, and the chi are 3.9, 9.0 eV, and 0.9 eV, respectively. For $Hf_{0.9}Si_{0.1}O_2$-second material 52, the k, the BG, and the chi are 18.0, 4.5 eV, and 2.0 eV, respectively. For $Hf_{0.5}Si_{0.5}O_2$-third material 50, the k, the BG, and the chi are 12.0, 6.5 eV, and 1.5 eV, respectively.

Figure 4:
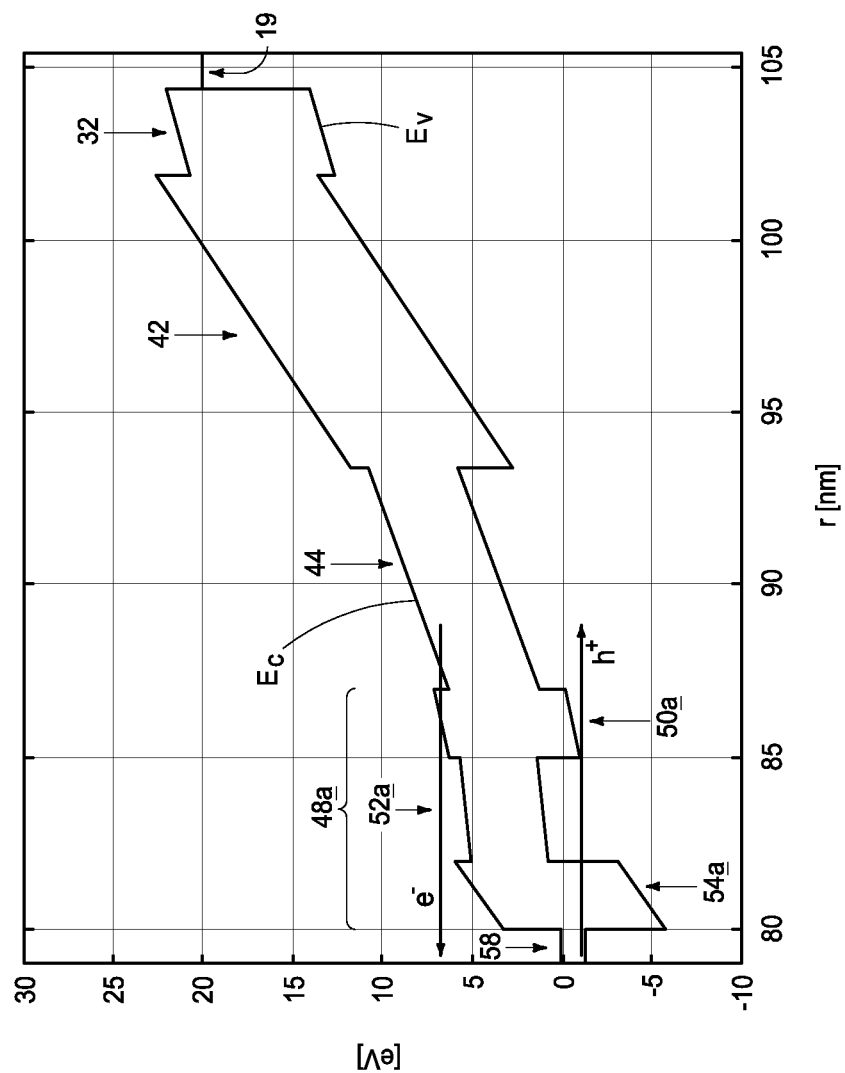
FIG. 4 is a band diagram illustrating example operational characteristics for another integrated structure analogous to that of FIG. 1 and an alternate to that of FIG. 2.

FIG. 4 shows an alternate example embodiment analogous to that shown by FIG. 2. Like numerals from the above-described-FIG. 2 embodiment have been used where appropriate, with some differences being indicated by the suffix "a". Charge-passage structure 48a comprises first material 54a, second material 52a, and third material 50a. First material 54a is silicon dioxide. Second material 52a is $Zr_{0.9}Al_{0.1}O_{1.95}$. Third material 50a is $Zr_{0.3}Si_{0.7}O_2$. For silicon-dioxide-first material 54a, the k, the BG, and the chi are again 3.9, 9.0 eV, and 0.9 eV, respectively. For $Zr_{0.9}Al_{0.1}O_{1.95}$-second material 52a, the k, the BG, and the chi are 27.7, 4.3 eV, and 1.7 eV, respectively. For $Zr_{0.3}Si_{0.7}O_2$-third material 50a, the k, the BG, and the chi are 12.6, 7.3 eV, and 1.1 eV, respectively.

Memory cells in accordance with the above-described first embodiment and in accordance with the above-described second embodiment provide greater erase and programming reliability while minimizing parasitic charge trapping within charge-passage structure 48 (and particularly in a middle material 52/52a) in comparison to prior art structures (e.g., such as a structure where the charge-passage structure comprises silicon dioxide-silicon nitride-silicon dioxide).

In this document, unless otherwise indicated, "elevational(ly)", "higher", "upper", "lower", "top", "atop", "bottom", "above", "below", "under", "beneath", "up", and "down" are generally with reference to the vertical direction. Further, "vertical" and "horizontal" as used herein are directions that are perpendicular or within 10 degrees of perpendicular relative one another independent of orientation of the substrate in three-dimensional space. "Horizontal" refers to a general direction (i.e., within 10 degrees) along a primary substrate surface and may be relative to which the substrate is processed during fabrication. Also, "extend(ing) elevationally" and "elevationally-extending" in this document encompasses a range from vertical to no more than 45° from vertical. Further, "extend(ing) elevationally", "elevationally-extending", and "vertical(ly)" with respect to a field effect transistor are with reference to orientation of the transistor's channel length along which current flows in operation between two source/drain regions of the transistor that are at two different elevations.

Any of the materials, regions, and structures described herein may be homogenous or non-homogenous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples.

In this document, "thickness" by itself (no preceding directional adjective) is defined as the mean straight-line distance through a given material or region perpendicularly from a closest surface of an immediately adjacent material of different composition or of an immediately adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials ore regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

CONCLUSION

In some embodiments, a memory cell comprises, in the following order, channel material, a charge-passage structure, charge-storage material, a charge-blocking region, and a control gate. The charge-passage structure comprises a first material closest to the channel material, a third material furthest from the channel material, and a second material between the first material and the third material. Dielectric constant (k) of the first material is less than 5.0. Sum of bandgap (BG) and electron affinity (chi) of the second material is no greater than 6.7 eV. The k of the second material is at least 5.0. Sum of BG and chi of the third material is less than 9.0 eV and at least 0.5 eV greater than the sum of the BG and the chi of the second material.

In some embodiments, a memory cell comprises, in the following order, channel material, a charge-passage structure, charge-storage material, a charge-blocking region, and a control gate. The charge-passage structure comprises a first material closest to the channel material, a third material furthest from the channel material, and a second material between the first material and the third material. Dielectric constant (k) of the first material is from 3.5 to less than 5.0, bandgap (BG) of the first material is from 8.5 eV to 9.5 eV, and electron affinity (chi) of the first material is from 0.7 eV to 1.1 eV. The k of the second material is from 5.0 to 60.0, BG of the second material is from 3.5 eV to 5.0 eV, and chi of the second material is from 1.0 eV to 3.0 eV. The k of the third material is less than the k of the second material and at least 4.0, BG of the third material is from 4.0 eV to 7.0 eV, and chi of the third material is from 1.0 eV to 2.5 eV.

In some embodiments, an integrated structure comprises a vertical stack comprising vertically-alternating levels of conductive material and insulator material. Channel material extends elevationally along the vertical stack. A charge-passage structure is laterally outward of and extends elevationally along the channel material. The charge-passage structure comprises a first material closest to the channel material, a third material furthest from the channel material, and a second material between the first material and the third material. Dielectric constant (k) of the first material is less than 5.0. Sum of bandgap (BG) and electron affinity (chi) of the second material is no greater than 6.7 eV. The k of the second material is at least 5.0. Sum of BG and chi of the third material is less than 9.0 eV and at least 0.5 eV greater than the sum of the BG and the chi of the second material. Charge-storage material is laterally outward of the charge-passage structure and within the levels comprising conductive material. A charge-blocking region is within the levels comprising conductive material. The charge-blocking region is laterally outward of the charge-passage structure and laterally inward of the conductive material.

In some embodiments, an integrated structure comprises a vertical stack comprising vertically-alternating levels of conductive material and insulator material. Channel material extends elevationally along the vertical stack. A charge-passage structure is laterally outward of and extends elevationally along the channel material. The charge-passage structure comprises a first material closest to the channel material, a third material furthest from the channel material, and a second material between the first material and the third material. Dielectric constant (k) of the first material is from 3.5 to less than 5.0, bandgap (BG) of the first material is from 8.5 eV to 9.5 eV, and electron affinity (chi) of the first material is from 0.7 eV to 1.1 eV. The k of the second material is from 5.0 to 60.0, BG of the second material is from 3.5 eV to 5.0 eV, and chi of the second material is from 1.0 eV to 3.0 eV. The k of the third material is less than the k of the second material and at least 4.0, BG of the third material is from 4.0 eV to 7.0 eV, and chi of the third material is from 1.0 eV to 2.5 eV. Charge-storage material is laterally outward of the charge-passage structure and within the levels comprising conductive material. A charge-blocking region is within the levels comprising conductive material. The charge-blocking region is laterally outward of the charge-passage structure and laterally inward of the conductive material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising, in the following order:
channel material;
a charge-passage structure;
charge-storage material;
a charge-blocking region;
a control gate; and
the charge-passage structure comprising:
    a first material closest to the channel material, a third material furthest from the channel material, and a second material between the first material and the third material;
    dielectric constant (k) of the first material being less than 5.0;
    sum of bandgap (BG) and electron affinity (chi) of the second material being no greater than 6.7 eV, k of the second material being at least 5.0; and
    sum of BG and chi of the third material being less than 9.0 eV and at least 0.5 eV greater than the sum of the BG and the chi of the second material.

2. The memory cell of claim 1 wherein the first material is directly against the second material and the second material is directly against the third material.

3. The memory cell of claim 2 wherein the first material is directly against the channel material and the third material is directly against the charge-storage material.

4. The memory cell of claim 1 wherein the k of the first material is at least 3.5.

5. The memory cell of claim 4 wherein at least a majority of the first material is silicon oxide.

6. The memory cell of claim 1 wherein the sum of the BG and the chi of the second material is at least 4.5 eV.

7. The memory cell of claim 6 wherein the sum of the BG and the chi of the second material is at least 5.0 eV.

8. The memory cell of claim 6 wherein the sum of the BG and the chi of the second material is no greater than 6.5 eV.

9. The memory cell of claim 8 wherein the sum of the BG and the chi of the second material is no greater than 6.0 eV.

10. The memory cell of claim 1 wherein the k of the second material is no greater than 60.0.

11. The memory cell of claim 10 wherein the k of the second material is from 10.0 to 40.0.

12. The memory cell of claim 11 wherein the k of the second material is from 10.0 to 25.0.

13. The memory cell of claim 10 wherein the second material comprises at least one of an oxide, a silicate, an aluminate and a gallate of hafnium, zirconium, tantalum, niobium, or titanium, or mixtures of two or more of hafnium, zirconium, tantalum, niobium, and titanium.

14. The memory cell of claim 13 wherein the at least one of oxide, silicate, aluminate and gallate is stoichiometric.

15. The memory cell of claim 13 wherein the at least one of oxide, silicate, aluminate and gallate is non-stoichiometric.

16. The memory cell of claim 13 wherein the at least one of oxide, silicate, aluminate and gallate including a mixture of two or more of hafnium, zirconium, tantalum, niobium, and titanium.

17. The memory cell of claim 10 wherein the second material is devoid of silicon nitride.

18. The memory cell of claim 1 wherein the sum of the BG and the chi of the third material is at least 5.0 eV.

19. The memory cell of claim 18 wherein the sum of the BG and the chi of the third material is from 7.0 eV to 8.5 eV.

20. The memory cell of claim 19 wherein the sum of the BG and the chi of the third material is from 7.5 eV to 8.0 eV.

21. The memory cell of claim 18 wherein the third material comprises at least one of an oxide, a silicate, an aluminate and a gallate of hafnium, zirconium, tantalum, niobium, or titanium, or mixtures of two or more of hafnium, zirconium, tantalum, niobium, and titanium.

22. A memory cell, comprising, in the following order:
channel material;
a charge-passage structure;
charge-storage material;
a charge-blocking region;
a control gate; and
the charge-passage structure comprising:
  a first material closest to the channel material, a third material furthest from the channel material, and a second material between the first material and the third material;
  dielectric constant (k) of the first material being from 3.5 to less than 5.0, bandgap (BG) of the first material being from 8.5 eV to 9.5 eV, and electron affinity (chi) of the first material being from 0.7 eV to 1.1 eV;
  k of the second material being from 5.0 to 60.0, BG of the second material being from 3.5 eV to 5.0 eV, and chi of the second material being from 1.0 eV to 3.0 eV; and
  k of the third material being less than the k of the second material and at least 4.0, BG of the third material being from 4.0 eV to 7.0 eV, and chi of the third material being from 1.0 eV to 2.5 eV.

23. The memory cell of claim 22 wherein the first material is directly against the second material, the second material is directly against the third material, and the first material is silicon oxide.

24. The memory cell of claim 22 wherein the first material is directly against the second material, the second material is directly against the third material, and the first material is devoid of silicon oxide.

25. The memory cell of claim 22 wherein the first material is directly against the second material, the second material is directly against the third material, and the second material is devoid of silicon nitride.

26. The memory cell of claim 22 wherein the k of the second material is at least 9.0.

27. The memory cell of claim 22 wherein the BG of the second material is less than 5.0 eV.

28. The memory cell of claim 22 wherein the chi of the second material is at least 2.0 eV.

29. The memory cell of claim 22 wherein the k of the second material is at least 9.0, the BG of the second material is less than 5.0 eV, and the chi of the second material is at least 2.0 eV.

30. The memory cell of claim 22 wherein,
sum of the BG and the chi of the second material is no greater than 6.7 eV; and
sum of the BG and the chi of the third material is less than 9.0 eV and at least 0.5 eV greater than the sum of the BG and the chi of the second material.

31. An integrated structure, comprising:
a vertical stack comprising vertically-alternating levels of conductive material and insulator material;
channel material extending elevationally along the vertical stack;
a charge-passage structure laterally outward of and extending elevationally along the channel material, the charge-passage structure comprising:
  a first material closest to the channel material, a third material furthest from the channel material, and a second material between the first material and the third material;
  dielectric constant (k) of the first material being less than 5.0;
  sum of bandgap (BG) and electron affinity (chi) of the second material being no greater than 6.7 eV, k of the second material being at least 5.0; and
  sum of BG and chi of the third material being less than 9.0 eV and at least 0.5 eV greater than the sum of the BG and the chi of the second material;
charge-storage material laterally outward of the charge-passage structure and within the levels comprising conductive material; and
a charge-blocking region within the levels comprising conductive material, the charge-blocking region being laterally outward of the charge-passage structure and laterally inward of the conductive material.

32. The integrated structure of claim 31 comprising a NAND memory array wherein the levels of conductive material comprise wordline levels.

33. An integrated structure, comprising:
a vertical stack comprising vertically-alternating levels of conductive material and insulator material;
channel material extending elevationally along the vertical stack;
a charge-passage structure laterally outward of and extending elevationally along the channel material, the charge-passage structure comprising:
  a first material closest to the channel material, a third material furthest from the channel material, and a second material between the first material and the third material;
  dielectric constant (k) of the first material being from 3.5 to less than 5.0, bandgap (BG) of the first material being from 8.5 eV to 9.5 eV, and electron affinity (chi) of the first material being from 0.7 eV to 1.1 eV;
  k of the second material being from 5.0 to 60.0, BG of the second material being from 3.5 eV to 5.0 eV, and chi of the second material being from 1.0 eV to 3.0 eV; and
  k of the third material being less than the k of the second material and at least 4.0, BG of the third material being from 4.0 eV to 7.0 eV, and chi of the third material being from 1.0 eV to 2.5 eV;
charge-storage material laterally outward of the charge-passage structure and within the levels comprising conductive material; and
a charge-blocking region within the levels comprising conductive material, the charge-blocking region being laterally outward of the charge-passage structure and laterally inward of the conductive material.

34. The integrated structure of claim 33 comprising a NAND memory array wherein the levels of conductive material comprise wordline levels.

* * * * *